United States Patent [19]

Van Ommeren

[11] E Re. 29,947

[45] Reissued Mar. 27, 1979

[54] SEMICONDUCTOR PATTERN DELINEATION BY SPUTTER ETCHING PROCESS

[75] Inventor: Otte Van Ommeren, Hamburg, Fed. Rep. of Germany

[73] Assignee: U.S. Philips Corporation, New York, N.Y.

[21] Appl. No.: 854,115

[22] Filed: Nov. 23, 1977

Related U.S. Patent Documents

Reissue of:

[64] Patent No.: 3,984,300
Issued: Oct. 5, 1976
Appl. No.: 548,006
Filed: Feb. 7, 1975

[30] Foreign Application Priority Data

Feb. 12, 1974 [NL] Netherlands ..... 7401859

[51] Int. Cl.[2] ..... C23C 15/00

[52] U.S. Cl. ..... 204/192 E

[58] Field of Search ..... 204/192 E, 192 EC

[56] References Cited

U.S. PATENT DOCUMENTS

| | | | |
|---|---|---|---|
| 3,400,066 | 9/1968 | Caswell et al. | 204/192 |
| 3,436,327 | 4/1969 | Shockley | 204/192 |
| 3,649,503 | 3/1972 | Terry | 204/192 |
| 3,676,317 | 7/1972 | Harkins, Jr. | 204/192 |
| 3,791,952 | 2/1974 | Labuda et al. | 204/192 |

*Primary Examiner*—John H. Mack
*Assistant Examiner*—Aaron Weisstuch
*Attorney, Agent, or Firm*—David R. Treacy; Norman N. Spain

[57] ABSTRACT

A layer is patterned by sputter etching using a photoresist as a sputter-etch-mask and using a thin metal layer between the mask and the layer or layer-system to be patterned. The metal layer is extremely thin and consists of a metal that is itself useless as a sputter-etch-mask. The process is especially important in the manufacture of semiconductor devices.

5 Claims, 4 Drawing Figures

SEMICONDUCTOR PATTERN DELINEATION BY SPUTTER ETCHING PROCESS

Matter enclosed in heavy brackets [ ] appears in the original patent but forms no part of this reissue specification; matter printed in italics indicates the additions made by reissue.

SUMMARY OF THE INVENTION

The invention relates to a method of manufacturing a pattern from one or more layers on a substratum by the local removal of said layer or layers by sputter etching over at least a part of the thickness of the layer or the system of layers while using a masking pattern which is resistant to sputter etching and which consists of a photoresist on an intermediate layer of a material which can be removed selectively with respect to the layer present immediately below it and to be patterned by sputter etching, the masking photoresist and the intermediate layer being removed after the sputter etching treatment. The invention furthermore relates to articles, in particular semiconductor devices, manufactured by using said method.

BACKGROUND OF THE INVENTION

"Sputter etching" is to be understood to mean herein a method for the removal of material by ion bombardment. The material to be removed or the underlying substrate may itself serve as a cathode in a gas discharge or be cathodically biased; it is also possible to place the substrate with the layer or layers to be removed locally in the path of the bombarding ions of a gas discharge. Since the bombarding ions are impinging on the object with the material to be removed, in a substantially equal direction, the boundary of the etching will accurately follow the edge of the masking used. In this manner, a much more accurate boundary of layers to be etched away can in principle be realized than in chemical etching, in which the boundary can extend below the mask by underetching.

A difficulty in sputter etching, however, was to obtain a good mask which could be removed selectively after the etching treatment. For that purpose it was known, for example, to choose a material which was sputtered away at a comparatively low speed as compared with the layer or the system of layers which had to be given a certain pattern by sputter etching and which are soluble in a chemical etchant which did not attack the underlying layer to be masked locally. The masking layer was given the desired pattern by means of a thin layer of photoresist followed by a chemical etching treatment of the masking layer. In general the photoresist layer was then removed, although in special cases it could also be retained, since in the chemical etching treatment which was carried out to remove the masking layer after sputter etching a system of layers consisting mainly of silver any photoresist layer is lifted-off. By way of example, for the sputter etching of such a system of layers having a thickness of 1 μm, a mask layer of aluminum with a thickness of 0.5 μm was used which could easily be etched selectively by means of sodium hydroxide solution. The masking layer was comparatively thick in said known method. In chemical etching treatment of a pattern in said comparatively thick masking layer, a proportional extent of underetching is difficult to avoid so that the boundary of the sputter etching is less accurately defined.

It was also known that a photoresist layer itself was readily useful as a masking pattern for sputter etching. A difficulty was that photoresist layers which had been exposed to an ion bombardment could be removed with difficulty only afterwards. In order to be able to better remove such a photoresist layer which had been exposed to ion bombardment, it was known to use an intermediate layer of polyvinylformal directly on the masked parts of the layer to be removed locally by sputter etching. After sputter etching, the photoresist pattern with the underlying polyvinylformal layer were removed by an ultrasonic treatment in ethylene dichloride.

However, such an intermediate layer of polyvinylformal can be provided in a small thickness only with difficulty and will generally be at least approximately 1 μ thick. In order to obtain the photoresist pattern, a developer may be used which also dissolves the parts of the polyvinylformal layer exposed during the development, or said exposed parts should be dissolved in a separate step after the development. It is of importance that said local dissolving of the exposed parts should be done as completely as possible. Actually, organic polymers are generally resistant to sputter etching treatments. Remnants of the intermediate layer at the site where the photoresist has been removed may disturb or prevent a uniform sputtering away of the underlying layer or layers. A long lasting etching treatment on the contrary may result in a stripping off of the photoresist pattern or at least give a certain underetching of said pattern. In the latter case, a less accurate definition of the boundary of the sputter etching will be obtained due to the comparatively large thickness of the intermediate layer. Edge parts, if any, of the photoresist pattern projecting as a result of the underetching may actually sag during the sputter etching and fold onto the sides of the remaining parts of the intermediate layer. Furthermore it is possible that due to the ion bombardment and the released thermal energy the polymeric intermediate layer can also be removed with greater difficulty only.

One of the objects of the present invention is to provide a method which does not exhibit the above-mentioned drawbacks.

According to the invention, a method of the kind described in the preamble is characterized in that the intermediate layer consists of a thin layer of a metal which can be removed by sputter etching at a rate which is at least of the same order as the rate at which the material of the underlying layer to be removed locally can be removed by sputter etching or as the average rate at which the system of the underlying layers to be removed locally can be removed by sputter etching, the masking pattern comprising the photoresist being removed after the sputter etching treatment by selectively etching away the intermediate layer. A thin layer is to be understood to mean herein layers having thicknesses smaller than 0.5 μm; the thickness of the intermediate layer is preferably at most 0.3 μm. Such a thin metal layer would in itself not be suitable for use as a mask against sputter etching.

Where the sputter etching rate of the intermediate layer is compared here with the sputter etching rate of the underlying layer to be removed locally or with the average sputter etching rate of the system of layers to be removed locally, said comparison relates to the same methods of performing the sputter etching treatment.

The average sputter etching rate of a system of layers is to be understood to mean herein the quotient $$\left[ \frac{\sum_{p=1}^{n} d_p}{\sum_{p=1}^{n} \frac{d_p}{V_p}} \right]$$

of said system of layers of n layers, wherein $V_p$ is the sputter etching rate of the material of the $p^{th}$ layer and $d_p$ is the thickness of the $p^{th}$ layer. Two rates of the same order is to be understood to mean herein that one rate is at least half and at most twice the other rate.

When, according to the preferred embodiment, the free parts of the intermediate layer are etched away selectively after the manufacture of the masking pattern from the photoresist and prior to sputter etching, a shortlasting etching treatment will suffice in view of the small thickness of the intermediate layer, in which underetching along the edges of the masking pattern can be restricted to a minimum. Possible sagging of the edge portions of the masking pattern is also a minimum so that a more accurate definition of the boundaries of the pattern to be manufactured can be achieved.

However, it is also possible, according to a further preferred embodiment, to omit the last-mentioned etching treatment of the free parts of the thin intermediate layer and to remove said free parts also during the sputter etching treatment so that an underetching effect need not be taken into account at all. In contrast with the known intermediate layer, the intermediate layer in the method according to the invention can easily be removed by sputter etching due to the material used therein and its small thickness.

Generally speaking, the invention may be used in those cases in which layers are to be provided in an accurately determined pattern. Such great accuracies are of importance in particular for those fields of technology in which great accuracies and layer parts with microscopically small dimensions are of importance, such as in optics and electronics, in particular in the manufacture of semiconductor devices, for example, integrated circuits. It is known, for example, to provide contact windows of very small dimensions as accurate as possible in an insulating layer, for example, a silicon oxide layer, present on a semiconductor surface, for example, of silicon. The method according to the invention is of particular importance to provide conductor patterns with conductor tracks having widths which are as accurate as possible and often as small as possible at very small mutual distances, in which the conductors should be given a reasonable thickness so as to keep the resistance of the conductors low. The remaining parts of the locally removed layer or the locally removed system of layers which consists of electrically conductive material and electrically conductive materials, respectively, may advantageously be used in semiconductor devices as a pattern of conductors which is at least partly present on an insulation layer. It will be obvious that for such applications the method according to the invention is to be considered in particular. It has proved possible, for example, with a thickness of the layer or the system of layers of at least 0.5 μm, to provide a local gap with a width of at most 2 μm.

In principle, the pattern of the layer or of the system of layers present one on top of the other can be removed locally throughout the thickness by sputter etching. It should be taken into account that the material of the substrate present immediately below the sputtered-away material may be exposed to the ion bombardment for a short time. As to how far such bombardment is permissible, should be considered for each individual case. In the case of the manufacture of a pattern of conductors on a semiconductor which is covered by an insulation layer, ions impinging upon said insulation layer may produce static charges which may cause undesired surface properties in the semiconductor, such as inversion channels and instabilities as a result of slow migration of said charges. Furthermore, the substrate surface may be sensitive to the etchant which is used to remove the intermediate layer and to lift the photoresist mask. In such cases, the sputter etching treatment may be continued in known manner until only a thin layer remains. This remaining thin layer may be removed by means of a short-lasting etching treatment in such manner that underetching is minimized.

BRIEF DESCRIPTION OF THE DRAWINGS

The invention will be described in greater detail with reference to the following embodiment and to the accompanying drawing in which.

DESCRIPTION OF THE PREFERRED EMBODIMENT

Figure 1:
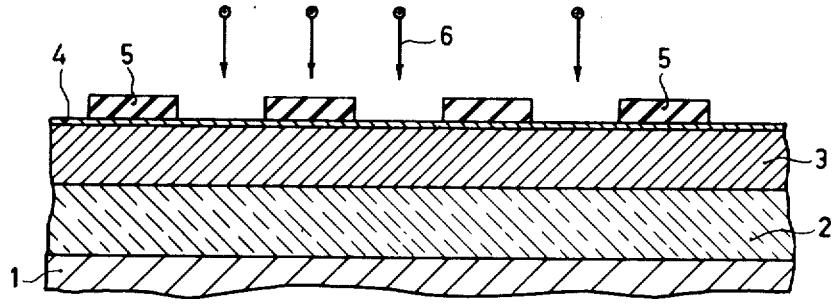
FIGS. 1 to 4 are diagrammatic cross-sectional views of stages during the provision of conductive metal tracks which are present at a short distance from each other on a substrate according to the embodiment.

The embodiment relates to the provision of conductor tracks on a substrate as may be used in the manufacture of semiconductor devices. According to the present example the substrate consists of a semiconductor body 1, for example of silicon, on which an insulation layer 2 is provided, for example, of silicon dioxide. The semiconductor body 1 may comprise parts of different conductivity types and contact windows (not shown) may be provided locally in the insulation layer 2 so as to provide underlying parts of the semiconductor body with contacts by providing a suitable metal layer in such a contact window. By means of conductive strips on the insulation layer such a contact may then be connected again to other contacts or to connection places to provide connection conductors, for example, in the form of metal wires. As is known, aluminum may be used in planar semiconductor devices of silicon both for contacts on p-type and/or n-type silicon in the windows and for the conductive strips on the insulation layer. Aluminium may also be used locally on the insulation layer as a gate electrode of an IGFET (field effect transistor having a gate electrode which is separated from the gate region by insulating material). It is the object of the present embodiment to show how it is possible to provide a number of narrow conductive strips at a small manual distance from each other, which is of importance in particular in manufacturing monolithic integrated circuits of a very compact shape.

For the provision of low-resistance conductive strips it is of importance that the strips should have not too small a cross-section. Since for a compact construction the track width should be small, it is endeavoured to use a sufficient thickness.

The following example describes the manufacture of aluminium tracks having a thickness of 1 μm, a width of 1-1.5 μm and spaced apart 1.5-2 μm. For that purpose, a layer 3 of aluminium, thickness 1 μm, is first provided in known manner, for example by vapour deposition in a vacuum, on the whole side of the substrate where the semiconductor body 1 is covered (at least partly), with the insulation layer 2. By a local etching treatment, the desired pattern with conductor tracks is to be formed in said layer 3, use being made of a photoresist layer. However, prior to the provision of the photoresist layer, first a thin intermediate metal layer 4 of molybdenum is provided, for example, with a thickness of only 0.2 μm. The rate at which molybdenum can be sputtered-off in a given sputter etching treatment is of the same order as (namely approximately 4/5 of) the rate at which aluminium can be removed by sputtering in a corresponding sputter etching treatment. The thin molybdenum layer 4 may be provided in known manner by sputtering.

A photoresist layer is then provided, for example, with a thickness of 1 μm. The photoresist layer is separated from the aluminium layer 3 by the thin intermediate layer 4 of molybdenum. A pattern 5 which may be used as a mask in the subsequent etching treatment is formed from the photoresist in known manner. The resultant stage is shown in FIG. 1.

The free parts of the thin molybdenum layer 4 may be etched away by a short-lasting etching treatment. Since the molybdenum layer is very thin, the free parts of the molybdenum layer are etched away completely in a sufficiently short time to cause only a slight underetching below the photoresist pattern 5, provided the etching treatment is discontinued in time.

In the present case, however, said etching step is omitted in which the above-described very slight underetching does not occur either.

For the formation of the desired aluminium pattern, the non-masked parts of the molybdenum layer 4 and the underlying parts of the aluminium layer 3 are subjected to a sputter etching treatment by bombarding in the usual manner with ion radiation 6 obtained from a gas discharge in an argon atmosphere.

Figure 2:
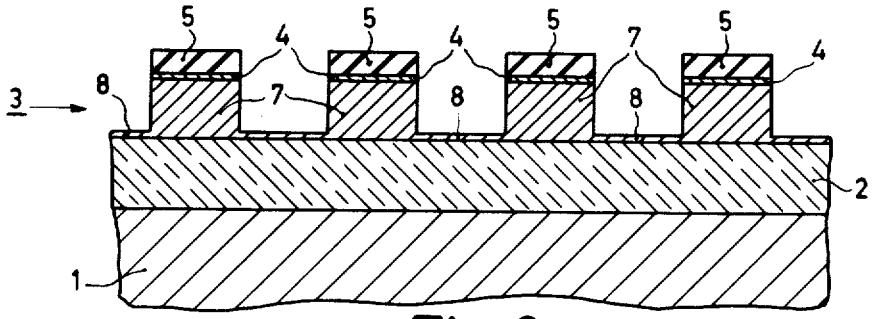

Sputter etching is continued for such a period as is necessary to maintain thin parts 8 of the aluminium layer 3 with a thickness of 0.1-0.2 μm at the site of the non-masked surface parts, which time is determined experimentally by preceding tests with test samples. The resultant stage is shown in FIG. 2. Below the photoresist masking 5 and the underlying remaining parts of the thin intermediate layer 4 of molybdenum, parts 7 of the aluminium layer 3 are maintained with the original thickness of 1 μm. The charge formed locally at the surface by the ion bombardment is removed via the remaining aluminium. By maintaining the thin aluminium portions 8 charge accumulation at the surface of the insulation layer 2 is prevented.

Figure 3:
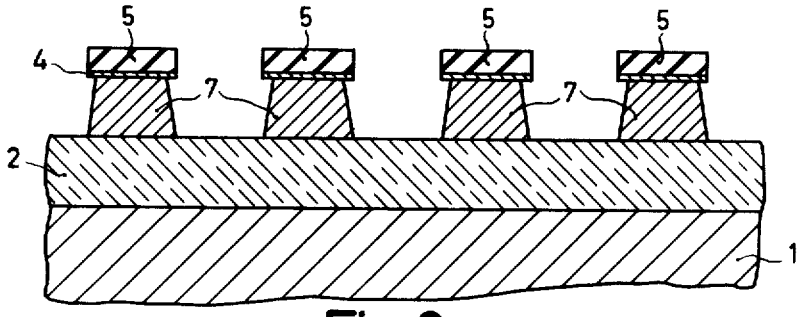

A short-lasting chemical etching treatment in phosphoric acid is then carried out until the layer parts 8 of aluminium are etched away completely. Only a very small narrowing of the thick parts 7 occurs by underetching. The resultant stage is shown in FIG. 3.

Figure 4:
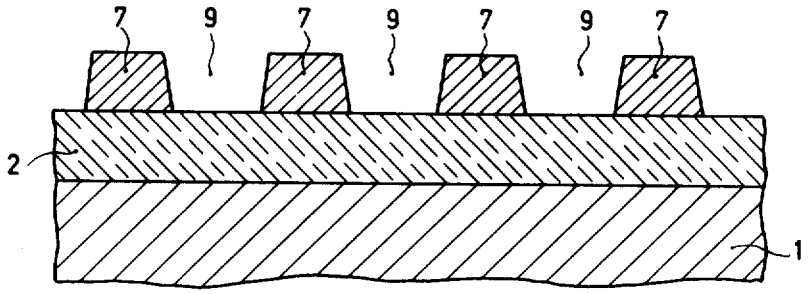

Finally, for the removal of the masking photoresist pattern 5 the underlying parts of the molybdenum intermediate layer 4 are removed by a chemical etching treatment. In the present case a substantially high-rate etchant, namely fuming nitric acid, was used which does not attack the underlying aluminium. The resulting stage is shown in FIG. 4. The juxtaposed aluminium strips 7 shown in ths figure and having thicknesses of 1 μm and widths between 1 and 1.5 μm constitute gaps 9 having widths of at most 2 μ.

Of course the invention is not restricted to the present embodiment. Within the scope of the present invention many other combinations of materials which can be removed by sputtering and suitable metals for the intermediate layer are possible. Comparisons of sputter etch rates of various metals and other materials are known per se, while those skilled in the art can also easily choose selectively etchable metals for use as an intermediate layer in combination with various materials to be removed by sputtering locally. It is also possible, for example, to obtain molybdenum patterns by sputter etching with the use of a thin intermediate aluminium layer. The aluminium may be dissolved selectively with phosphoric acid.

What is claimed is:

1. A method of manufacturing a pattern from a layer or a series of layers of material removable by sputter etching from a substrate, said method comprising applying to said layer or series of layers a *thin* coating of a metal removable by sputter etching at a rate which is [from] at least [one half] *of the same order as* the rate of [that of] *removal of* the underlying layer or of the average of the underlying series of layers, *a rate of the same order as another rate being defined as being at least half and at most twice the other rate,* said *thin* metal coating having a thickness of less than 0.5 μm and being thinner than said underlying layer or series of layers, providing a sputter etch photoresist mask of desired configuration on selected portions of said thin metal coating to define a pattern of exposed areas, removing said thin *metal* coating from said exposed areas and sputter etching the resultant exposed areas of said layer or series of layers to thereby remove the layer or series of layers in said exposed areas and then removing by etching said thin *metal* coating present in the areas protected by said photoresist mask and thereby lifting off said photoresist mask from the resultant pattern.

2. A method as claimed in claim 1, characterized in that the thin metal coating has a thickness of at most 0.3 μm.

3. A method as claimed in claim 1 wherein the exposed areas of the thin metal coating are removed by a selective etching treatment after the formation of the photoresist pattern and preceding the sputter etching treatment.

4. A method as claimed in claim 2, wherein the exposed areas of the thin metal coating are removed by a sputter etching treatment after the formation of the photoresist pattern.

5. A method as claimed in claim 1 wherein the layer or the system of layers has a thickness of more than 0.5 μm and a gap is locally provided therein with a width of at most 2 μm.

* * * * *